(12) United States Patent
Itakura

(10) Patent No.: US 6,456,270 B1
(45) Date of Patent: Sep. 24, 2002

(54) INTEGRATED CIRCUIT DEVICE AND LIQUID CRYSTAL DISPLAY APPARATUS USING THE SAME

(75) Inventor: Tetsuro Itakura, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/512,826

(22) Filed: Feb. 25, 2000

(30) Foreign Application Priority Data

Feb. 25, 1999 (JP) ............................................. 11-048327

(51) Int. Cl.[7] ................................................. G09G 3/36
(52) U.S. Cl. ............................ 345/98; 345/92; 345/206
(58) Field of Search ............................. 345/87, 90, 92, 345/94, 98, 99, 100, 204, 206; 327/407, 408, 415, 416

(56) References Cited

U.S. PATENT DOCUMENTS

| 5,162,670 | A | | 11/1992 | Itakura et al. | |
|---|---|---|---|---|---|
| 5,343,089 | A | | 8/1994 | Itakura et al. | |
| 5,376,841 | A | | 12/1994 | Itakura et al. | |
| 5,471,171 | A | | 11/1995 | Itakura et al. | |
| 5,767,698 | A | * | 6/1998 | Emeigh et al. | 326/80 |
| 5,913,075 | A | * | 6/1999 | Beers et al. | 341/126 |
| 5,929,697 | A | * | 7/1999 | Chang | 323/315 |
| 6,130,549 | A | * | 10/2000 | Buck | 326/26 |

* cited by examiner

*Primary Examiner*—Kent Chang
(74) *Attorney, Agent, or Firm*—Oblon, Spivak, McClelland, Maier & Neustadt, P.C.

(57) ABSTRACT

An integrated circuit device has a plurality of amplifier circuits integrated within a chip, and includes current mirror circuits constituted by a plurality of diode-connected input-side transistors for receiving a current for setting a bias current, and a plurality of output transistors for respectively supplying output currents corresponding to the received current, as bias currents, to the amplifier circuits. The input-side transistors are distributed to the plurality of amplifier circuits.

22 Claims, 14 Drawing Sheets

INTEGRATED CIRCUIT DEVICE AND LIQUID CRYSTAL DISPLAY APPARATUS USING THE SAME

CROSS-REFERENCE TO RELATED APPLICATION

This application is based upon and claims the benefit of priority from the prior Japanese Patent Application No. 11-048327, filed Feb. 25, 1999, the entire contents of which are incorporated herein by reference.

BACKGROUND OF THE INVENTION

The present invention relates to an integrated circuit device fabricated by integrating many electronic circuits such as amplifier circuits, and a liquid crystal display apparatus and, more particularly, to an integrated circuit device designed to reduce bias current deviations between chips, and a liquid crystal display apparatus using the integrated circuit device as an amplifier circuit for a driver circuit.

A display driver circuit in a conventional liquid crystal display apparatus comprises first memory elements which are equal in number to pixels required for one horizontal line and used to store a digital video signal (to be referred to as an RGB signal hereinafter), a shift register for transferring a timing pulse for storing the RGB signal, second memory elements for further storing the RGB signal stored in the first memory elements in a cycle of one horizontal period, a group of D/A converters (DACS) for converting the RGB signal stored in the second memory elements into an analog value, and a group of amplifier circuits for receiving the RGB signal converted by the group of DACs into the analog value and driving signal lines and liquid crystal cells of the liquid crystal display panel. Each liquid crystal cell to which the voltage of the RGB signal converted into the analog value is applied changes in transparency in accordance with the voltage value, thereby determining the brightness of the corresponding pixel.

In this case, a bias current for the group of amplifier circuits is set in accordance with a bias signal generated by one bias circuit. More specifically, a current $I_{bias}$ generated in the bias circuit is supplied to a diode-connected transistor in the bias circuit, and the gate voltage of this transistor is applied to each amplifier circuit of the group of amplifier circuits.

In each amplifier circuit, the gate voltage of the diode-connected transistor is applied to a gate of a transistor and converted into a current. This converted current is used as a bias current in each amplifier circuit. That is, the transistors of the bias circuit and amplifier circuit constitute a current mirror circuit. The transistors of the bias circuit and amplifier circuit respectively serve as the input- and output-side transistors of the current mirror circuit.

Although the number of amplifier circuits included in the group of amplifier circuits depends on the specifications of a liquid crystal display apparatus, an apparatus using amorphous silicon TFTs for a liquid crystal display panel uses as many as 3,000 amplifier circuits. It is therefore difficult to integrate the group of amplifier circuits into one chip. For this reason, such amplifier circuits are generally fabricated into a plurality of chips. In this case, a bias circuit is provided for each chip. In general, one chip incorporates about 300 amplifier circuits.

These amplifier circuits are integrated to be arrayed in a chip. The input-side transistor (the transistor of a bias circuit) of a current mirror circuit is placed on either end of this amplifier circuit array. For example, the input-side transistor is placed beside the amplifier circuit on the left end.

MOS transistors are generally used as the transistors of a bias circuit and amplifier circuit. In general, MOS transistors deviate in threshold voltage (Vt) within a certain range between different chips and within the same chip. Assume that the transistors of amplifier circuits deviate in threshold voltage. Even in this case, if the number of amplifier circuits in one chip is as many as 300, the transistors of the amplifier circuits generally exhibit little difference, even between different chips, in the manner in which the threshold voltage deviates.

If, however, the diode-connected transistors in the bias circuits deviate in threshold voltage between chips, bias currents flowing in the transistors in the amplifier circuits deviate in accordance with the deviations in threshold voltage, resulting in differences in current consumption and characteristics between the chips. The difference in current consumption between the chips greatly affects the power supply design of the liquid crystal display apparatus, and hence is undesired. In addition, the deviations in characteristics between the chips lead to a deterioration in the image quality of the liquid crystal display apparatus.

As described above, according to the bias circuit arrangement for the amplifier circuits used for the conventional liquid crystal display apparatus, bias currents flowing in many transistors of the amplifier circuits in chips deviate between the chips, resulting in differences in current consumption and characteristics between the chips.

BRIEF SUMMARY OF THE INVENTION

It is an object of the present invention to provide an integrated circuit device which reduces deviations in bias current between chips to reduce differences in current consumption and characteristics between the chips and a liquid crystal display apparatus which realizes easy design by using the integrated circuit device as a driver circuit and reduces a deterioration in image quality.

According to the present invention, there is provided an integrated circuit device comprising a plurality of electronic circuits, and a current mirror circuit constituted by a plurality of diode-connected input-side transistors which receive an input current for setting a bias current and are distributed to the plurality of electronic circuits, and a plurality of output-side transistors which respectively supply output currents corresponding to the input current, as bias currents, to the plurality of electronic circuits, wherein the plurality of electronic circuits and the current mirror circuit are integrated into one chip.

According to the present invention, the plurality of electronic circuits are arrayed and integrated within the chip, and the input-side transistors are distributed to and arranged in every L (L is an integer not less than one) electronic circuits of the plurality of electronic circuits.

According to the present invention, the plurality of electronic circuits are arrayed and integrated within the chip, and only P (P is an integer satisfying P≦M) diode-connected input-side transistors in every M diode-connected input-side diodes are connected to each other so as to constitute current mirror circuits.

As described above, according to the integrated circuit device of the present invention, the plurality of diode-connected input-side transistors are arranged, which constitute the current mirror circuit, together with the output-side transistors for generating bias currents in the respective electronic circuits, and these input-side transistors are distributed and arranged, thereby making the averages of deviations in the threshold voltages of the input-side transistors of the respective chips become almost equal to each other between the chips. This therefore improves the matching between the input-side transistors and output-side transistors, and reduces differences in current consumption and characteristics between the chips.

According to the present invention, there is provided a liquid crystal display apparatus comprising a liquid crystal display constituted by a plurality of pixels, signal lines for selectively supplying video signals to the respective pixels and scanning lines crossing the signal lines, a driver circuit including a group of amplifier circuits which amplify video signals and supply the signals to the signal lines and drives the signal lines, and a selector circuit which selects the scanning lines, wherein the group of amplifier circuits are integrated into a plurality of chips in units of a predetermined number of amplifier circuits, each of the chips including integrated current mirror circuits fabricated by a plurality of diode-connected input-side transistors which receive an input current for setting a bias current, and a plurality of output-side transistors which respectively supply output currents corresponding to the input current, as bias currents, to the amplifier circuits, and the plurality of input-side transistors are distributed to and arranged in the plurality of amplifier circuits incorporated in the respective chips.

As described above, if a group of amplifier circuits in a driver circuit for a liquid crystal display apparatus is fabricated by using the integrated circuit device of the present invention, a liquid crystal display apparatus can be realized, which allows easy design of a power supply, in particular, because of small differences in current consumption and characteristics between the chips, and exhibits little deterioration in image quality due to deviations in characteristics.

According to the present invention, there is provided an integrated circuit device comprising a plurality of output transistors which receive a setting voltage for setting a bias current and supply output currents as bias currents to electronic circuits, a plurality of monitoring transistors which are distributed to and arranged in the plurality of electronic circuits and output monitoring currents upon reception of the setting voltage, and an amplifier which amplifies a voltage corresponding to a difference between the monitoring current and a set input current and outputting the setting voltage.

According to the present invention, there is provided a liquid crystal display apparatus comprising a liquid crystal display constituted by a plurality of pixels, signal lines for selectively supplying video signals to the respective pixels and scanning lines crossing the signal lines, a group of amplifier circuits which amplify video signals and supplying the signals to the signal lines, a driver circuit which drives the signal lines, and a selector circuit which selects the scanning lines, wherein the group of amplifier circuits are integrated into a plurality of chips in units of a predetermined number of amplifier circuits, and each of the chips comprises a plurality of output transistors which receive a setting voltage for setting a bias current and supplying output currents as bias currents to the amplifier circuits, a plurality of monitoring transistors which are distributed to and arranged in the plurality of amplifier circuits and output monitoring currents upon reception of the setting voltage, and an amplifier which amplifies a voltage corresponding to a difference between the monitoring current and a set input current and outputting the setting voltage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
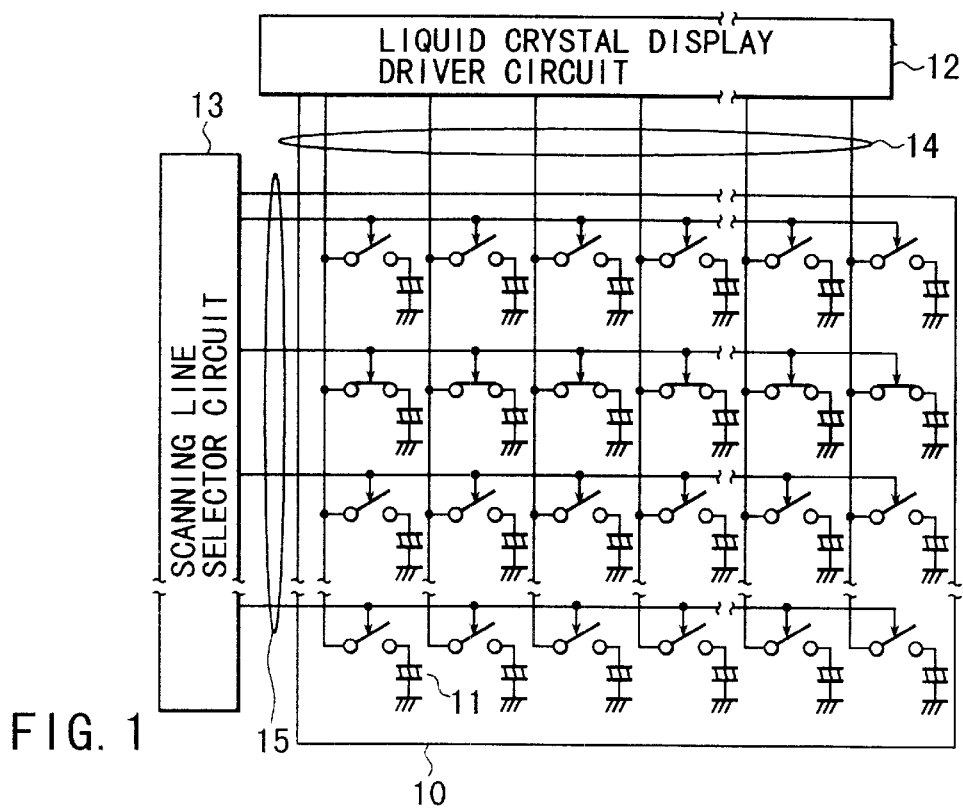
FIG. 1 is a block diagram showing the arrangement of a liquid crystal display apparatus.

FIG. 1 shows a liquid crystal display apparatus to which the present invention is applied. This liquid crystal display apparatus comprises a liquid crystal display panel 10, a liquid crystal display driver circuit 12 which supplies a video signal to signal lines, and a scanning line selector circuit 13 which selectively drives scanning lines. The liquid crystal display panel (LCD panel) 10 is made up of many liquid crystal cells 11 arranged in the form of a matrix, a plurality of signal lines 14 to which a video signal is supplied, and a plurality of scanning lines 15 crossing these signal lines 14.

The liquid crystal display driver circuit 12 of the liquid crystal display apparatus comprises memory elements 22 which are equal in number to pixels required for one horizontal line and are used to store a digital video signal (to be referred to as an RGB signal hereinafter), a shift register 21 which transfers a timing pulse for storing the RGB signal, memory elements 23 which further store the RGB signal stored in the memory elements 22 in a cycle of one horizontal period, a group of D/A converters (DACs) 24 which converts the 1-horizontal-line RGB signal stored in the memory elements 23 into an analog value, and a group of amplifier circuits 25 which receive the RGB signal converted by the group of DACs 24 into the analog value and drive the signal lines 14 and liquid crystal cells 11 of the liquid crystal display apparatus. Each liquid crystal cell 11 to which the voltage of the RGB signal converted into the analog vale changes in transparency in accordance with the voltage value, thereby determining the brightness of the corresponding pixel.

Figure 2:
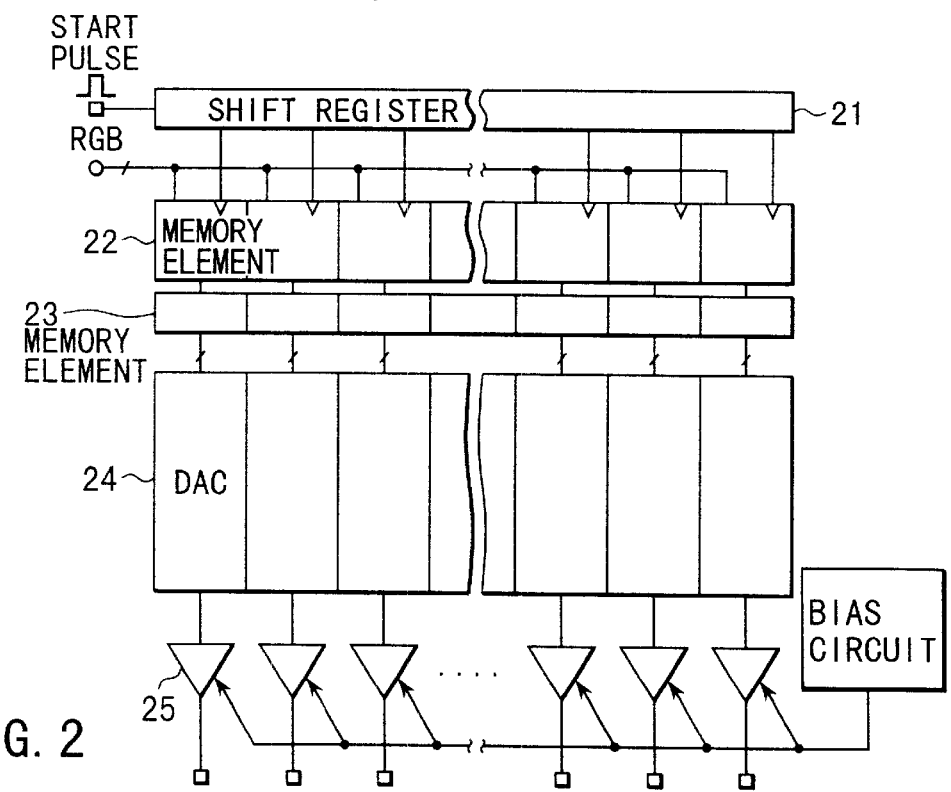
FIG. 2 is a circuit diagram showing the arrangement of a liquid crystal display driver circuit in FIG. 1.
Figure 3:
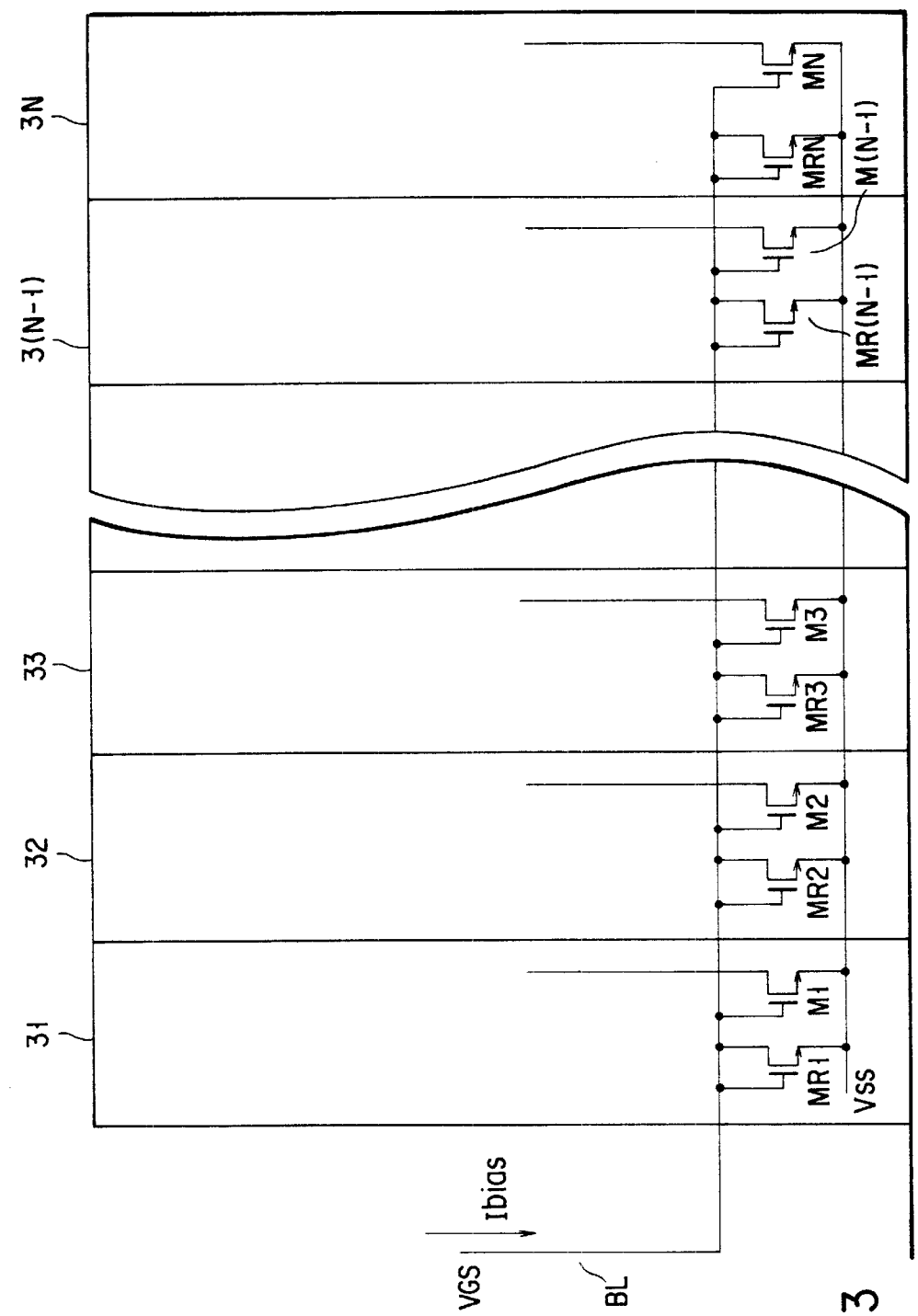
FIG. 3 is a block diagram showing the arrangement of an integrated circuit device according to the first embodiment of the present invention.

FIG. 3 shows a 1-chip integrated circuit device according to the first embodiment of the present invention which is used for the above liquid crystal display apparatus. This integrated circuit device has a plurality of (N) amplifier circuits 31 to 3N. The amplifier circuits 31 to 3N constitute part of the group of amplifier circuits 25 in FIG. 2, which is included in the liquid crystal display driver circuit 12 of the liquid crystal display apparatus shown in, for example, FIG. 1. These amplifier circuits are arranged in a line in a chip in the lateral direction in FIG. 3.

Bias current mirror circuits are respectively arranged in the amplifier circuits 31 to 3N. The bias current mirror circuits respectively have diode-connected transistors MR1 to MRN as input-side transistors and transistors M1 to MN as output-side transistors. In this case, these transistors MR1 to MRN and M1 to MN are MOS transistors.

The gates and drains of the input-side transistors MR1 to MRN are connected to each other, that is, these transistors are diode-connected. The transistors MR1 to MRN are further connected to a line to which a current $I_{bias}$ for setting a bias current is supplied, i.e., a bias current setting line BL. The sources of the input-side transistors MR1 to MRN are connected to a driving power supply line Vss. The gates of the output-side transistors M1 to MN are connected to the gates and drains of the input-side transistors MR1 to MRN, i.e., the bias current setting line BL. The sources of the transistors M1 to MN are connected to the driving power supply line Vss. The drains of the output-side transistors M1 to MN are connected to circuits which are formed in the amplifier circuits 31 to 3N to receive bias currents.

Figure 4:
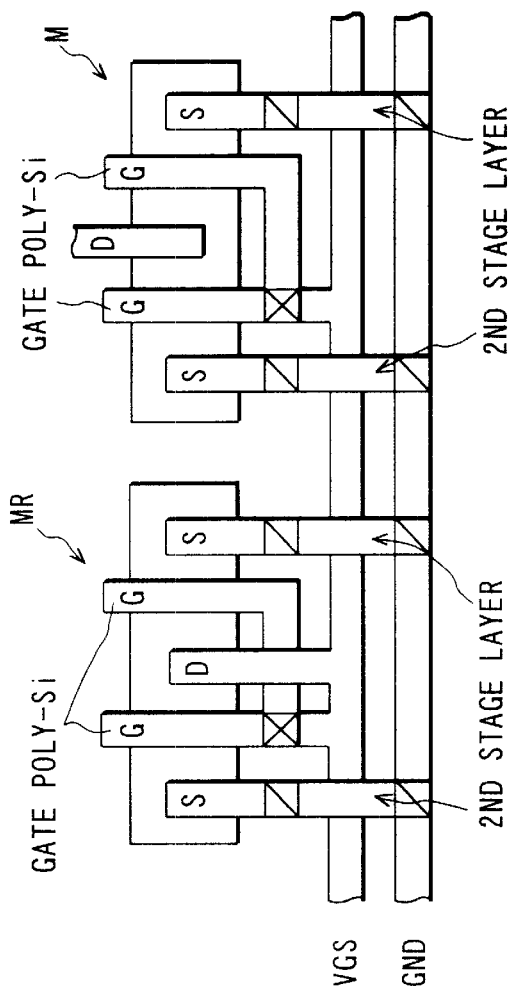
FIG. 4 is a view showing an array pattern of input- and output-side transistors.

According to the characteristic feature of this embodiment, the input-side transistors MR1 to MRN of the current mirror circuits serving parts of the bias circuits as described above are distributed to and arranged in the amplifier circuits 31 to 3N. In this embodiment, the current $I_{bias}$ for setting a bias current, which is supplied through the bias current setting line BL, is input to the transistors MR1 to MRN of the N amplifier circuits 31 to 3N. These input-side transistors MR1 to MRN are arranged near the output-side transistors M1 to MN for generating bias currents in the amplifier circuits 31 to 3N. As shown in FIG. 4, the input-side transistor MR is placed near the output-side transistor M. In other words, the gate electrodes G of the transistor MR are formed of a first stage layer made of polysilicon and connected to a VGS wiring layer consisting of a first stage layer. The source electrodes S of the transistor MR are connected to a GND wiring layer consisting of a first stage layer via a wiring layer consisting of a second stage layer. The drain electrode D of the transistor MR is connected to the VGS wiring layer. The gate electrodes G of the transistor M arranged near the transistor MR are formed of a first stage layer made of polysilicon and connected to the VGS wiring layer. The source electrodes S of the transistor MR are connected to the GND wiring layer via a wiring layer consisting of a second stage layer.

Figure 5:
FIG. 5 is a transistor array pattern of the integrated circuit device in FIG. 3.

When the circuit pattern in FIG. 4 is used to form the overall circuit pattern of the amplifier circuits 31 to 3N, a plurality of circuit patterns, each identical to the circuit pattern in FIG. 4, are connected to each other in a line, as shown in FIG. 5.

With this arrangement of this embodiment, the conventional problem is solved in the following manner.

The gate-source voltage of each of the diode-connected input-side transistors MR1 to MRN is close to the average of the gate-source voltages of the transistors MR1 to MRN when a current of $I_{bias}/N$ flows in each of the transistors MR1 to MRN.

Let $\Delta V_{Ri}$ be a deviation in the threshold voltage (vt) of the input-side transistors MR1 to MRN, and $\Delta V_i$ be a deviation in the threshold voltage of the output-side transistors M1 to MN. In this case, the statistical expected value of $\Delta V_R$ is zero, and the actual average of $\Delta V_R$ is close to the statistical expected value, i.e., a value close to zero. For this reason, deviations in the threshold voltage of the input-side transistors MR1 to MRN, i.e., deviations in gate/source voltage between the chips, can be reduced. On the other hand, the deviations $\Delta V_i$ in the threshold voltage of the output-side transistors M1 to MN do not greatly differ between the chips. Therefore, differences in the current consumption of the amplifier circuits 31 to 3N between the chips can be reduced, and hence differences in the characteristics of the amplifier circuits 31 to 3N between the chips can be reduced.

The above phenomenon will be further described below.

A drain current Id flowing in each MOS transistor is given by $$I_d k(V_{GS}-V_t)^2 \tag{1}$$

where VGS is the gate-source voltage of the MOS transistor, Vt is a threshold voltage, and k is a coefficient.

When many transistors are used, the sum Id of drain currents is given by $$I_d \simeq k(V_{GS}-V_t+\Delta V_i)^2 \quad (2)$$

$$I_d \propto \sum_i k[(V_{GS} - V_t)^2 + 2(V_{GS} - V_t)\Delta V_i + \Delta V_i^2] \quad (3)$$

where $\Delta V_i$ is deviations in the threshold voltage $V_t$.

The deviations $$\sum_i \Delta V_i$$

in threshold voltage statistically become closer to zero with an increase in the number of transistors. Also, the deviation $$\sum_i \Delta V_i^2$$

is much smaller than $$\sum_i (V_{GS} - V_t)^2$$

and can be ignored. Therefore, the deviation approximates to the formula:

$$I_d \propto \sum_i k(V_{GS} - V_t)^2 \quad (4)$$

Accordingly, the sum $I_d$ of drain currents becomes almost constant. Similarly, consider a bias current $I_b$. The bias current $I_b$ is given by $$I_b k(V_{GS}-V_t+\Delta V_{Rj})^2 \quad (5)$$

When many MOS transistors are used, the bias current $I_b$ is given by $$I_b \propto \sum_j^M k[(V_{GS} - V_t + \Delta V_{Rj})^2 \quad (6)$$

$$\propto \sum_j^M k(V_{GS} - V_t)^2 + \sum k(Vt - V_{GS})\Delta V_{Rj} + \sum_j k\Delta V_{Rj}^2 \quad (7)$$

where $V_{Rj}$ indicates the deviation of the transistor MRj in the threshold voltage.

The deviations $\Delta V_{Rj}$ in threshold voltage statistically become closer to zero with an increase in the number of transistors. For this reason, the second term of the formula (7) can be statistically regarded as zero. Also, the deviation $$\sum_j \Delta V_{Ri}^2$$

is very smaller than $$\sum_j (V_{GS} - V_t)^2$$

and can be ignored. Therefore, the bias current $I_b$ is determined by $(V_{GS}-V_t)^2$ and thus $V_{GS}$ does not substantially change. That is, if a predetermined bias current $I_b$ is supplied to a plurality of transistors connected in parallel, no deviation in $V_{GS}$ occurs between the chips even if the $V_t$ of each transistor deviates.

As described above, according to this embodiment, the differences in the current consumption and characteristics of the amplifier circuits 31 to 3N between the chips can be reduced. If, therefore, the liquid crystal display driver circuits 12 of the liquid crystal display apparatus in FIG. 1 are fabricated by applying IC chips integrating these amplifier circuits 31 to 3N to the group of amplifier circuits 25 in FIG. 2, deviations in the current consumption and characteristics of the integrated liquid crystal display driver circuits 12 between the chips can be reduced. This makes it easy to design the apparatus, the power supply, in particular, and makes it possible to reduce a deterioration in image quality due to deviations in characteristics.

An integrated circuit device according to the second embodiment of the present invention will be described next with reference to FIG. 6.

In the first embodiment, as described above, the size of each of the input-side transistors MR1 to MRN of the current mirror circuits corresponds to the value obtained by dividing the size of one chip by the number N of amplifier circuits 31 to 3N in the chip. Since the number N of amplifier circuits 31 to 3N often takes a large value, e.g., 300, the input-side transistors MR1 to MRN become very small transistors. In practice, such transistors may be impossible or difficult to fabricate.

Figure 6:
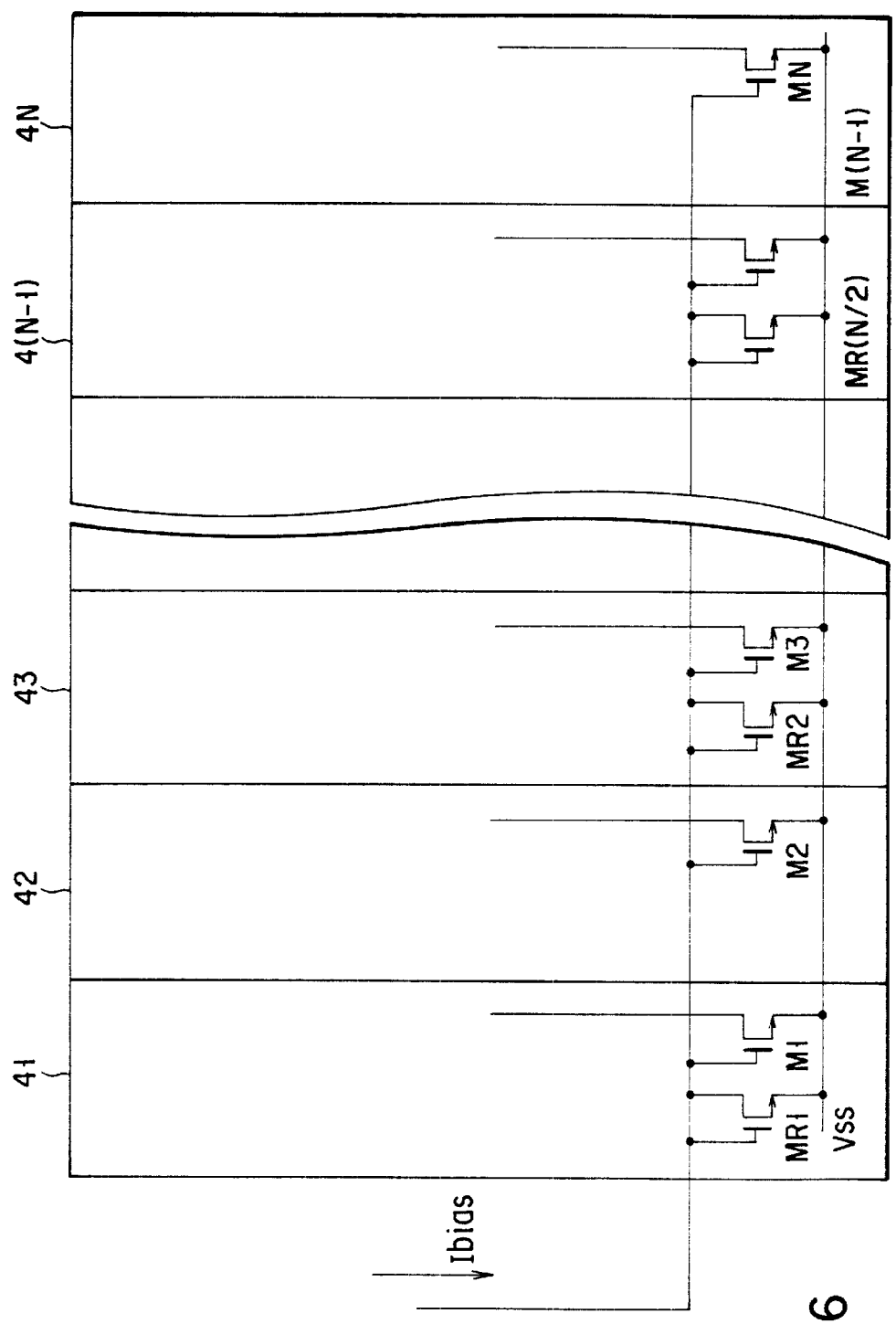
FIG. 6 is a circuit diagram showing the arrangement of an integrated circuit device according to the second embodiment of the present invention.

This embodiment shown in FIG. 6 is designed to make an improvement in this point. Input-side transistors MR1 to MR(N/L) are distributed to and arranged in every L (L is an integer not less than one, in this case L=2) amplifier circuits of a plurality of (N) amplifier circuits 41 to 4N arranged in a line. In other words, the division number of input-side transistor is set to N/L), and the divided input-side transistors MR1 to MR(N/L) are respectively arranged in every L amplifier circuits, i.e., the amplifier circuits 41, 43, ..., 4N.

As in the first embodiment, the gates and drains of the input-side transistors MR1 to MR(N/L) are connected to a bias current setting line to which a current $I_{bias}$ is supplied, and the sources of the transistors MR1 to MR(N/2) are connected to a driving power supply line Vss.

With this arrangement, the size of each of the input-side transistors MR1 to MR(N/L) becomes N/L) as compared with the first embodiment. This leads to easier integration. In addition, almost the same effects as those of the first embodiment can be obtained.

Figure 7:
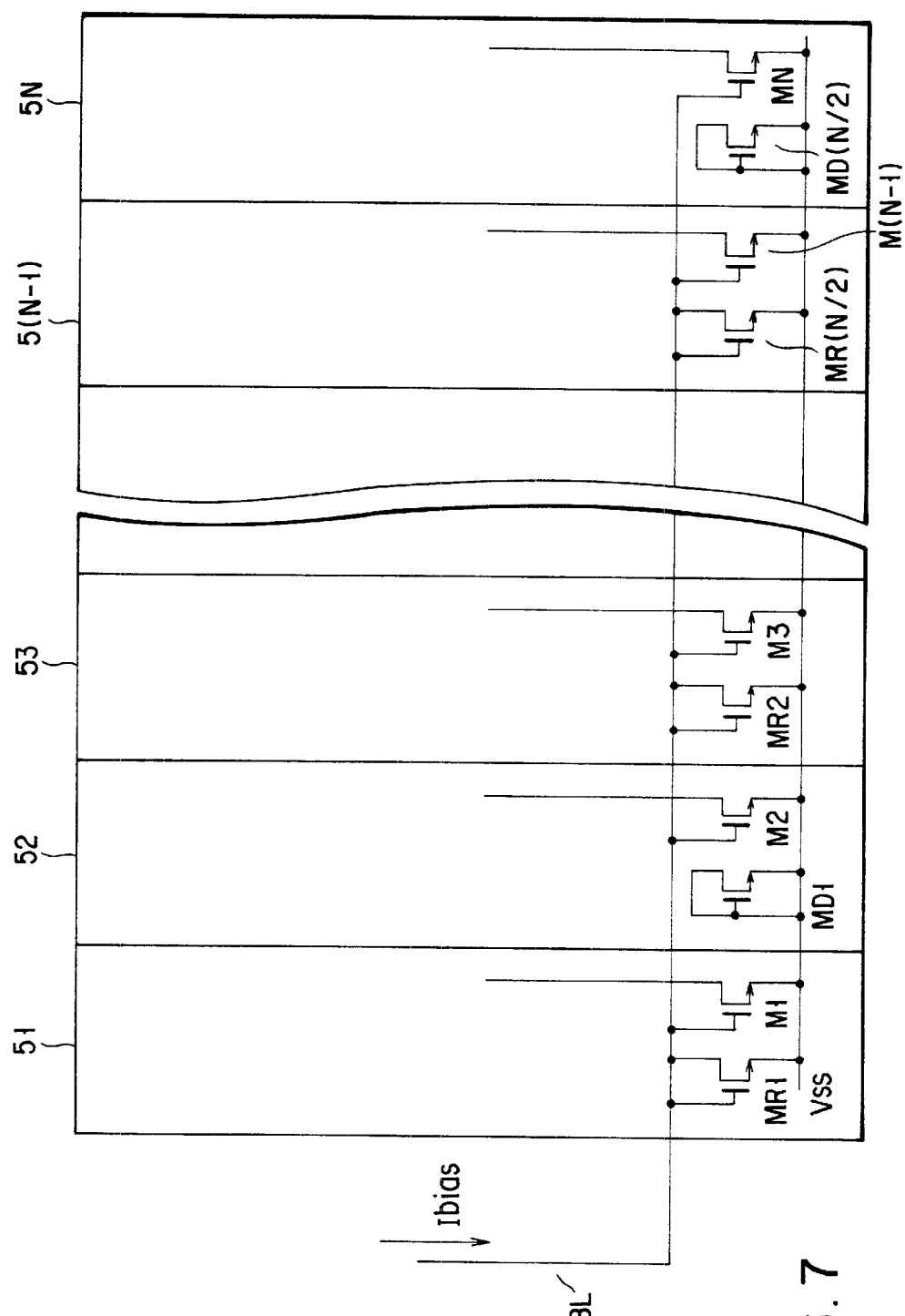
FIG. 7 is a circuit diagram showing the arrangement of an integrated circuit device according to the third embodiment of the present invention.

FIG. 7 shows the arrangement of an integrated circuit device according to the third embodiment of the present invention. Of the diode-connected transistors of a plurality of (N) amplifier circuits 51 to 5N arranged in a line in a chip, only P (P is an integer satisfying P≦M) transistors of every M (M is an integer not less than one) amplifier circuits of the amplifier circuits 51 to 5N are connected, together with output-side transistors, so as to form current mirror circuits.

FIG. 7 shows a case wherein M=2 and P=1. In this case, the drains and gates of only diode-connected transistors MR1, MR2, ..., MR(N/2) in the alternate amplifier circuits 51, 53, ..., 5(N−1) are connected to a bias current setting line to which a current $I_{bias}$ for setting a bias current is supplied, and form current mirror circuits, together with output-side transistors M1 to MN. The drains and gates of diode-connected transistors MD1, . . . , MD(N/2) in the remaining amplifier circuits 52, . . . , 5N are connected to a driving power supply line $V_{ss}$, but form no current mirror circuits.

This arrangement is suitable for integration. In general, when a plurality of identical circuits are to be integrated, one basic circuit pattern is laid out and used repeatedly to improve the layout efficiency in many cases. In this embodiment, an improvement in layout efficiency is attained by using this procedure.

Figure 8A:
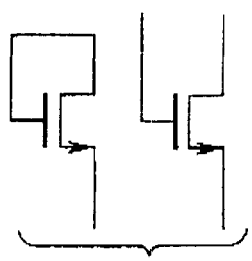
FIGS. 8A, 8B, and 8C are circuit diagrams respectively showing a basic circuit and final circuits of a bias circuit portion to explain the third embodiment.
Figure 8B:
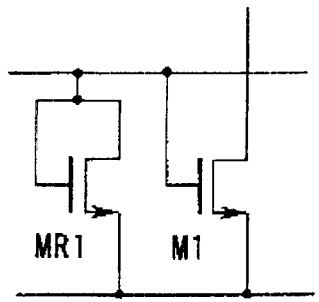
Figure 9A:
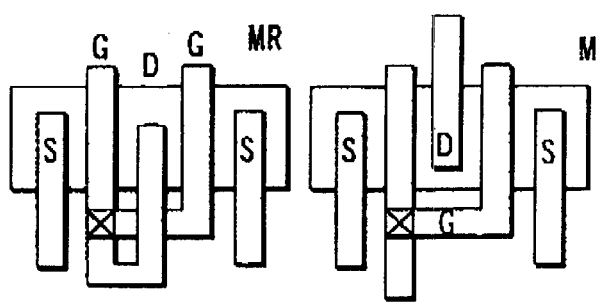
FIGS. 9A, 9B, and 9C are views respectively showing a basic pattern and final patterns which respectively correspond to the basic circuit and final circuits in FIGS. 8A, 8B, and 8C.
Figure 9B:
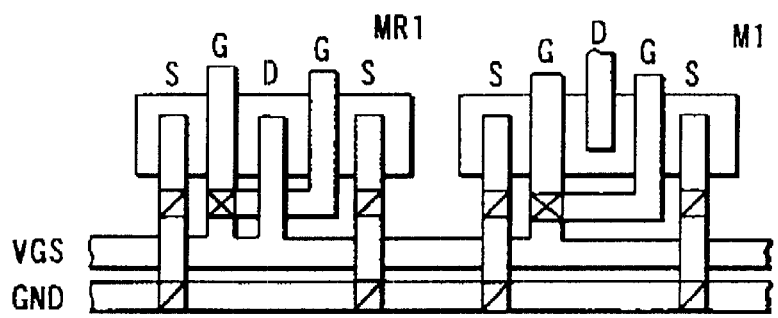

More specifically, N basic patterns each shown in FIG. 9A are prepared. Each basic pattern corresponds to a basic circuit constituted by a diode-connected transistor and a transistor that is not diode-connected, as shown in FIG. 8A. These N basic patterns are arranged in a line. As shown in FIG. 8B, the drain and gate of the diode-connected transistor and the drain of the transistor that is not diode-connected in the basic circuit in FIG. 8A are connected to a bias current setting line (the upper line in FIG. 8B), and the sources of the two transistors are connected to the power supply line $V_{ss}$ (the lower line in FIG. 8B). With this process, the circuit pattern shown in FIG. 9B is formed. This circuit pattern corresponds to, for example, the input-side transistor MR1 and output-side transistor M1 in FIG. 7.

Figure 8C:
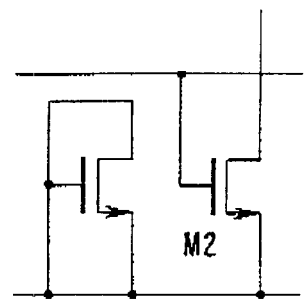
Figure 9C:
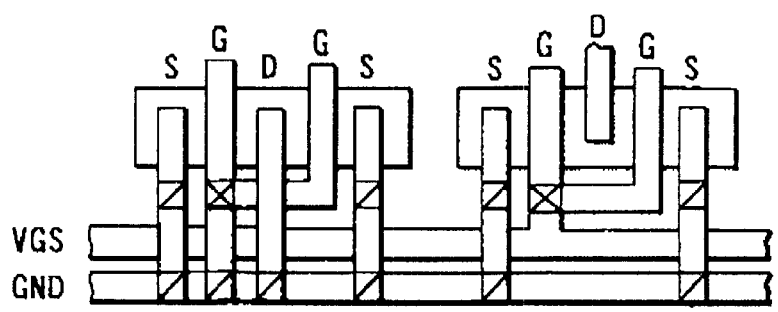

As shown in FIG. 8C, only the drain of the transistor that is not diode-connected in the basic pattern circuit in FIG. 8A is connected to the bias current setting line (the upper line in FIG. 8A), and the drain, gate, and source of the diode-connected transistor and the source of the transistor that is not diode-connected are connected to the power supply line $V_{ss}$ (the lower line in FIG. 8C). with this process, the circuit pattern shown in FIG. 9C is formed. This circuit pattern corresponds to the diode-connected transistor MD1 that is not part of any current mirror circuit and the output-side transistor M2 of the current mirror circuit in FIG. 7.

In the case of the amplifier circuit 42 in FIG. 6, the transistor MR is set in a non-connected state and only the transistor M is connected to the bias current setting line BL and power supply line in FIG. 9A.

Figure 10:
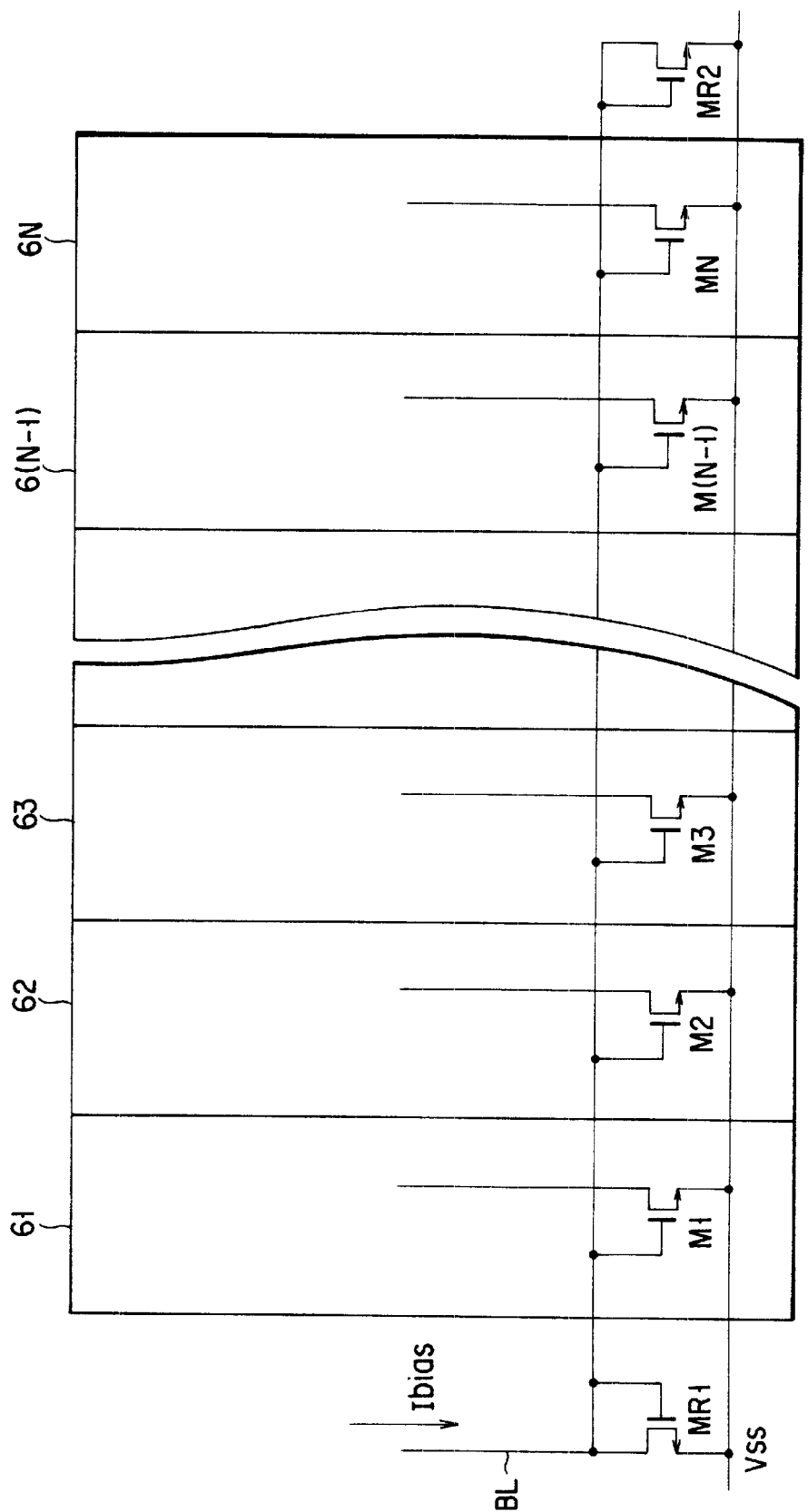
FIG. 10 is a circuit diagram showing the arrangement of an integrated circuit device according to the fourth embodiment of the present invention.

FIG. 10 shows the arrangement of an integrated circuit device according to the fifth embodiment of the present invention, in which diode-connected input-side transistors MR1 and MR2 of the current mirror circuits are respectively arranged on the two sides of an array of a plurality of (N) amplifier circuits 61 to 6N arranged in a line within a chip. As in the above embodiments described above, the gates and drains of the transistors MR1 and MR2 are connected to a bias current setting line BL to which a current $I_{bias}$ is supplied, and the sources of the transistors are connected to a power supply line $V_{ss}$.

According to this embodiment, the distances between the input-side transistors MR1 and MR2 and output-side transistors M1 to MN in the amplifier circuits 61 to 6N are decreased to realize better matching between the two transistors, thereby reducing deviations in the characteristics of the current mirror circuits.

In this embodiment, when the amplifier circuits 61 to 6N exist as a 1-chip integrated circuit, an integrated circuit device can be realized by only adding the transistors MR1 and MR2 to this integrated circuit.

Figure 11:
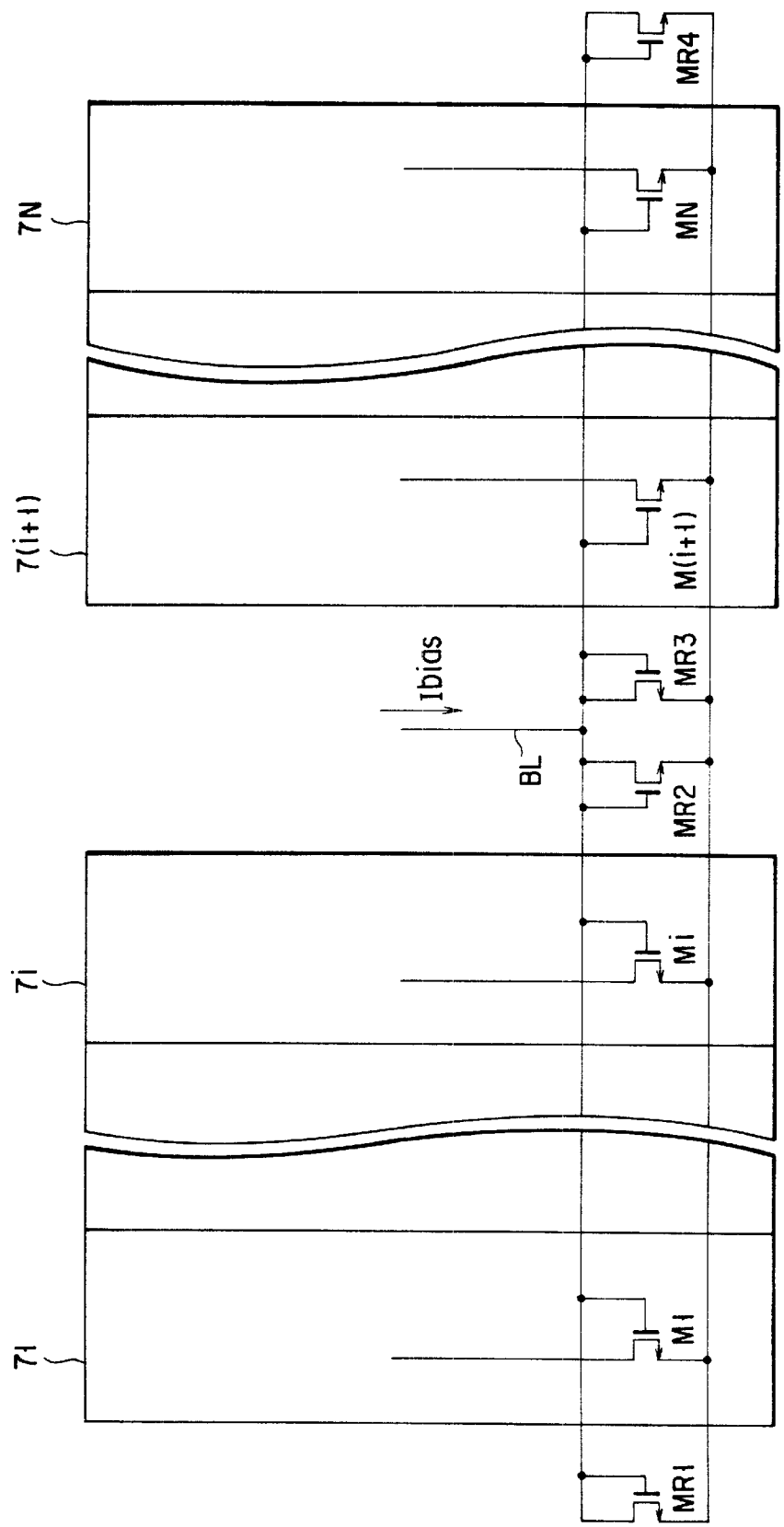
FIG. 11 is a circuit diagram showing the arrangement of an integrated circuit device according to the fifth embodiment of the present invention.

FIG. 11 shows the arrangement of an integrated circuit device according to the sixth embodiment of the present invention. In this embodiment, a bias current mirror circuit is placed midway along an array of a plurality of amplifier circuits in a chip. More specifically, diode-connected input-side transistors MR2 and MR3 of a current mirror circuit are arranged between an amplifier circuit 7i and an adjacent amplifier circuit 7(i+1) of amplifier circuits 71, . . . , 7i, 7(i+1), . . . , 7N. In addition, according to this embodiment, as in the fourth embodiment, diode-connected input-side transistors MR1 and MR4 of current mirror circuits are respectively arranged outside the amplifier circuits 71 and 7N on the two ends.

As in the embodiments described above, the gates and drains of the input-side transistors MR1, MR2, MR3, and MR4 are connected to a bias current setting line BL to which a current $I_{bias}$ is supplied, and the sources of the respective transistors are connected to a power supply line $V_{ss}$.

Each amplifier circuit described in the embodiments described above will be described next.

Figure 12:
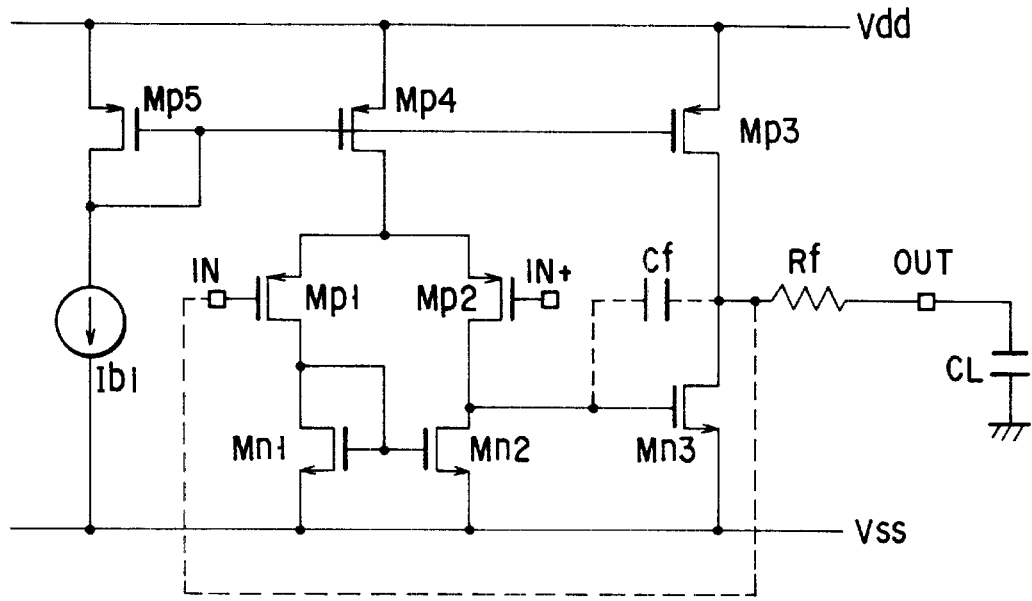
FIG. 12 is a circuit diagram showing an example of the arrangement of an amplifier circuit to which the present invention is applied.

The amplifier circuit shown in FIG. 12 is made up of an input amplification stage, output amplification stage, and resistor Rf. The input amplification stage comprises transistors Mp1 and Mp2 constituting a pair of differential transistors, a current source using a transistor Mp4 to supplying a tail current to the pair of differential transistors, and a current mirror circuit constituted by transistors Mn1 and Mn2 having current input and output terminals respectively connected to the drains as the output terminals of the pair of differential transistors. The output amplification stage is fabricated by a pair of complementary transistors constituted by transistors Mp3 and Mn3. Note that reference symbol Mpx denotes a P-channel MOS transistor; and Mnx, an N-channel MOS transistor.

According to this amplifier circuit, the first zero is formed in open loop frequency characteristics by the resistor Rf and capacitive component of a capacitive load CL inserted between the output terminal (the drains of the transistors Mn3 and Mp3) and a signal output terminal OUT. As a phase lead is introduced by this zero, the phase lag caused by poles can be compensated. More specifically, since the phase margin as the difference between the −180° phase and the phase at a gain of 1 can be increased, any phase compensation capacitance Cf for stabilizing the operation of the amplifier circuit is not basically required. Even if a phase compensation capacitance Cf is required, since only a very small capacitance is required, the chip area can be reduced. This action of the amplifier circuit is described in detailed in U.S. Ser. No. 09/128,414.

A diode-connected transistor Mp5 and bias current source Ib1 in FIG. 12 are constituted by output-side transistors Mi (i=1, 2, . . . , N) of current mirror circuits to determine a gate bias for the transistors Mp3 and Mp4.

Figure 13:
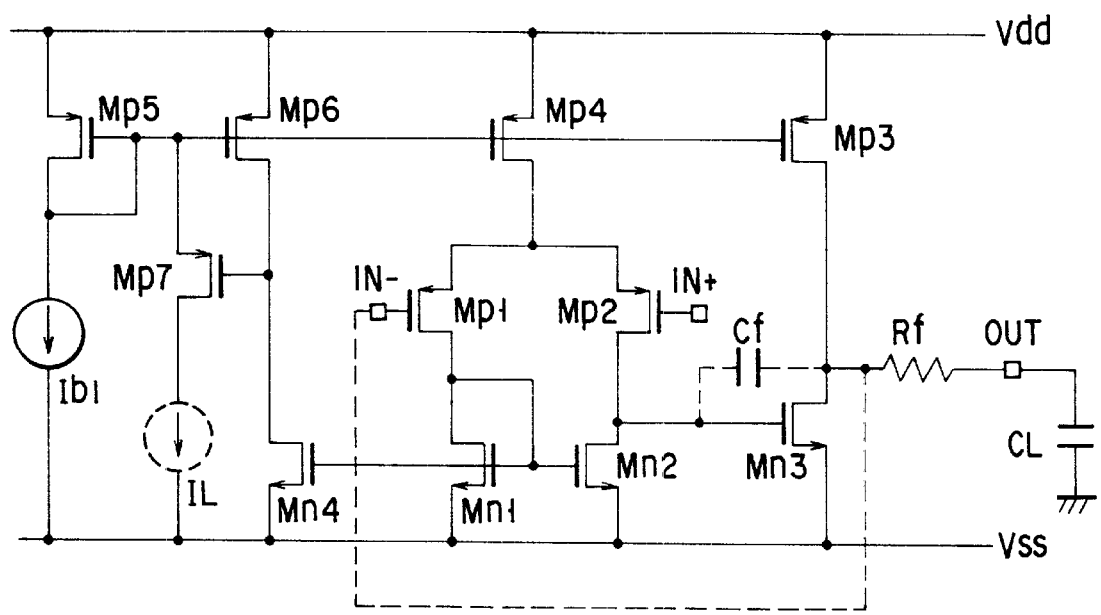
FIG. 13 is a circuit diagram showing another example of the arrangement of the amplifier circuit to which the present invention is applied.

FIG. 13 shows another amplifier circuit. In the amplifier circuit shown in FIG. 12, if a voltage follower arrangement is employed, in which a signal is fed back from the output terminal (the drains of the transistors Mn3 and Mp3) of the output amplification stage to a signal input terminal IN− as indicated by the dashed line in FIG. 12, the slew rate at rising is determined by the current supplied from the transistor Mp3 and the value of the capacitive load CL. Since the current supplied from the transistor Mp3 is small, a sufficient slew rate cannot be obtained.

In order to improve this point, in the amplifier circuit shown in FIG. 13, the output current from the transistor Mp3 for supplying a bias current to the output amplification stage is increased upon detection of a change in input signal voltage to positive polarity, thereby increasing the slew rate at rising. That is, a change in input signal voltage to positive polarity is detected by transistors Mn4 and Mp6, and a transistor Mp7 is turned on when the input signal voltage changes to positive polarity, thereby supplying a current from a current source IL to the diode-connected transistor Mp5 that determines a gate bias for the transistor Mp3. With this arrangement, the voltage of the gate bias of the transistor Mp3 is increased.

More specifically, a transistor Mp6 constitutes a current source, and its gate is connected to the drain and gate of the transistor Mp5 for determining a bias current. The gate of the transistor Mp7 is connected to the drains of the transistors Mn4 and Mp6. The source and drain of the transistor Mp7 are respectively connected to the drain and gate of the transistor Mp5 for determining a bias current and the current source IL.

For the sake of simplicity, assume that the transistor Mn4 is equal in size to the transistor Mn1 of an input amplification stage 2, i.e., equal in W/L (where W is the channel width of a MOS transistor, and L is the channel length of the MOS transistor), and a size (W/L) Mp6 of the transistor Mp6 is 0.6 times a size (W/L) Mp4 of the current source transistor Mp4 of the input amplification stage 2.

When the voltage applied between the signal input terminals IN+ and IN− is zero or negative, i.e., the voltage at the positive-side signal input terminal IN+ is lower than that at the negative-side signal input terminal IN−, a current ½ or less of the current supplied from the transistor Mp4 flows in the transistor Mn1, and the current in the transistor Mn1 is copied by the transistor Mn4. In this case, since the current supplied from the transistor Mp6 is 0.6 times the current supplied from the transistor Mp4 and larger than the current flowing the transistor Mn4. For this reason, the drain voltage of the transistor Mp6 becomes high, and the transistor Mp7 is turned off. As a consequence, the supplied from the current source IL is not added to the transistor Mp5.

If the input signal voltage applied between the signal input terminals IN+ and IN− is not less than a predetermined positive voltage, i.e., the voltage at the positive-side signal input terminal IN+ is higher than the voltage at the signal input terminal IN− by a predetermined level or higher, a current larger than 0.6 times the current supplied from the transistor Mp4 flows in the transistor Mn1, and the current in the transistor Mn1 is copied by the transistor Mn4. At this time, since the current supplied from the transistor Mp6 is 0.6 times the current supplied from the transistor Mp4, and hence is smaller than the current flowing in the transistor Mn4, the drain voltage of the transistor Mp6 decreases to turn on the transistor Mp7. With this operation, since the current supplied from the current source IL is added to the bias current setting transistor Mp5 through the transistor Mp7, the gate-source voltage of the transistor Mp5 increases, and the current supplied from the transistor Mp4 also increases.

As described above, the amplifier circuit shown in FIG. 13 can control the current supplied from the transistor Mp3 of an output amplification stage 3 to increase it as an input signal voltage changes to the positive polarity, the slew rate at rising can be increased.

The diode-connected transistor Mp5 and bias current source Ib1 in FIGS. 12 and 13 determine a gate bias for the transistors Mp3 and Mp4, and the bias current source Ib1 is formed by an output-side transistor Mi (i=1, 2, . . . , N) of a current mirror circuit described above. The current source IL shown in FIG. 13 can be realized by the same arrangement.

Figure 14:
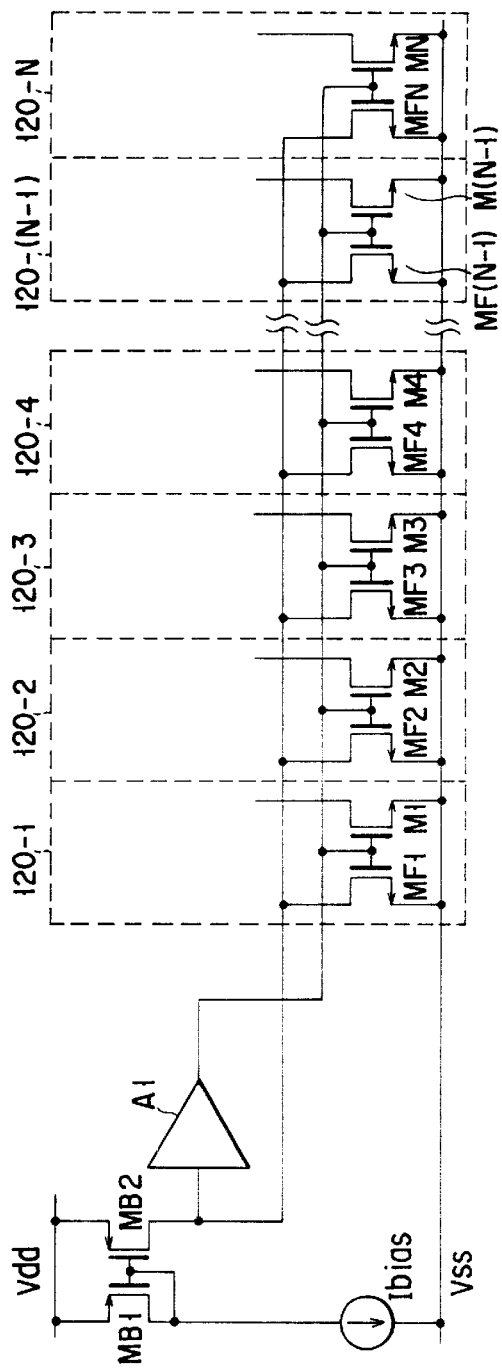
FIG. 14 is a circuit diagram showing the arrangement of an integrated circuit device according to the sixth embodiment of the present invention.

FIG. 14 shows an integrated circuit device according to the sixth embodiment of the present invention. This integrated circuit device has a plurality of (N) amplifier circuits 120-1 to 120-N. For example, the amplifier circuits 120-1 to 120-N constitute some of the group of amplifier circuits 25 in FIG. 2 which are included in the liquid crystal display driver circuit 12 of the liquid crystal display apparatus shown in FIG. 1. For example, these amplifier circuits are arranged in a line along the lateral direction in FIG. 14. The amplifier circuits 120-1 to 120-N respectively include bias current supplying transistors M1 to MN and monitoring transistors MF1 to MFN for receiving the same gate voltage to monitor the bias currents supplied from the bias current supplying transistors M1 to MN. That is, each of the amplifier circuits 120-1 to 120-N is made up of one of the bias current supplying transistors M1 to MN and one of the monitoring transistors MF1 to MFN, with each pair of a current supplying transistor and monitoring transistor having gates connected to each other and sources connected to each other. The drain of each of the monitoring transistors MF1 to MFN is connected to a current mirror circuit constituted by transistors MB1 and MB2.

A current $I_{bias}$ for setting a bias current is compared with the sum of currents output from the monitoring transistors MF1 to MFN through the current mirror circuit constituted by the transistors MB1 and MB2, and is converted into a voltage corresponding to the current difference at the drain terminal of the transistor MB2. This voltage is amplified by an amplifier A1 and commonly applied to the gates of the transistors M1 to MN and transistors MF1 to MFN.

For the sake of simplicity, assume that the respective output transistors Mi (i=1 to N) are equal in size, and so are the respective monitoring transistors MFi (i=1 to N). Assume also that the gate width/gate length (to be referred to as W/L hereinafter) of each transmission MFi (i=1 to N) is 1/N of the W/L of each transistor Mi (i=1 to N). If matching between all the transistors Mi and all the transistors MFi is obtained, since the same voltage is applied to the gates of the transistors Mi and transistors MFi, a current Ifi flowing in the transistors MFi is 1/N a current Ii flowing the transistors Mi. Since the drains of the transistors MFi are commonly connected, the currents flowing in the transistors MFi are added, and the sum is equal to the current Ii flowing in the transistors Mi.

The sum of the currents flowing in the transistors MFi is compared with the set current $I_{bias}$ at the drain terminal of the transistor MB2. If the current $I_{bias}$ is larger than the sum of the currents flowing in the transistors MFi, the drain voltage of the transistor MB2 increases. This drain voltage is amplified by the amplifier A1 to increase the gate voltage of the transistors Mi and transistors MFi so as to increase the currents flowing in the transistors MFi. As a consequence, the sum of the currents flowing in the transistors MFi becomes equal to the current $I_{bias}$. In contrast to this, if the current $I_{bias}$ is smaller than the sum of the currents flowing in the transistors MFi, the drain voltage of the transistor MB2 decreases. This drain voltage is amplified by the amplifier A1 to decrease the gate voltage of the transistors Mi and transistor MFi so as to decrease the currents flowing in the transistors MFi. As a consequence, the sum of the currents flowing in the transistors MFi becomes equal to the current $I_{bias}$.

According to the characteristic feature of this embodiment, the monitoring transistors are distributed to and arranged in the amplifier circuits 120-1 to 120-N, as described above. That is, this embodiment includes the N monitoring transistors MF1 to MFN corresponding to the number N of amplifier circuits 120-1 to 120-N unlike the prior art in which only one monitoring transistor MF is used. These monitoring transistors MF1 to MFN are arranged near the output transistors M1 to MN for generating bias currents in the amplifier circuits 120-1 to 120-N.

With this arrangement of this embodiment, the problem posed by deviations in the threshold voltage of each transistor in the prior art can be solved in the following manner.

The gate-source voltage commonly applied to the monitoring transistors becomes close to the average of the gate-source voltages of the transistors MF1 to MFN when a current of $I_{bias}/N$ flows in each of the transistors MF1 to MFN.

Let $\Delta V_{Fi}$ be deviations in the threshold voltage ($V_t$) of the monitoring transistors MF1 to MFN, and $\Delta V_t$ be deviations in the threshold voltage of the output transistors M1 to MN. In this case, the statistical expected value of $\Delta V_{Fi}$ is zero, and the actual average of deviations becomes a value close to the statistical expected value, i.e., zero. The sum of the current flowing in the transistors MFi is described as follows:

$$Id \propto \sum_i k(V_{GS} - Vt + \Delta V_{Fi})^2 \qquad (8)$$

$$Id \propto \sum_i k[(V_{GS} - Vt + \Delta V_{Fi})^2 + 2(V_{GS} - Vt)\Delta V_{Fi} + \Delta V_{Fi}^2] \qquad (9)$$

Since $$\sum_i 2k(V_{GS} - Vt)\Delta V_{Fi}$$

is close to zero and $$\sum_i \Delta V_{Fi}^2$$

is much smaller than $$\sum_i (V_{GS} - Vt)^2,$$

the equation (9) can be approximated as follows:

$$Id \propto \sum_i k(V_{GS} - Vt)^2$$

This means that when the sum of the currents flowing to the transistors MF1 to MFN is $I_d$, even if there is the deviation $\Delta V_{Fi}$ in the threshold voltage, the VGS becomes substantially equal to a value when $V_{Fi}=0$. Since the average of bias currents supplied from the transistors M1 to MN becomes closer to the current $1_{bias}$, the sum of the current consumption values of the amplifier circuits 120-1 to 120-N becomes closer to the sum of the current consumption values of the amplifier circuits 120-1 to 126-N when the bias current supplied to each of the amplifier circuits 120-1 to 120-N is the current $1_{bias}$ regardless of the chips. For this reason, the differences in current consumption between the chips can be reduced. In addition, by reducing the differences in current consumption between the chips, the differences in characteristics of the amplifier circuits 120-1 to 120-N between the chips can be reduced. As described above, according to this embodiment, the differences in current consumption and characteristics of the amplifier circuits 120-1 to 120-N between the chips can be reduced. If, therefore, the liquid crystal display driver circuits of the liquid crystal display apparatus in FIG. 1 are formed by applying chips obtained by integrating these amplifier circuits 120-1 to 120-N to the group of amplifier circuits 25 in FIG. 2, deviations in the current consumption and characteristics of the integrated liquid crystal display driver circuits 12 between the chips can be reduced. This makes it easy to design the apparatus, the bias circuits, in particular, and makes it possible to reduce a deterioration in image quality due to deviations in characteristics.

Figure 15:
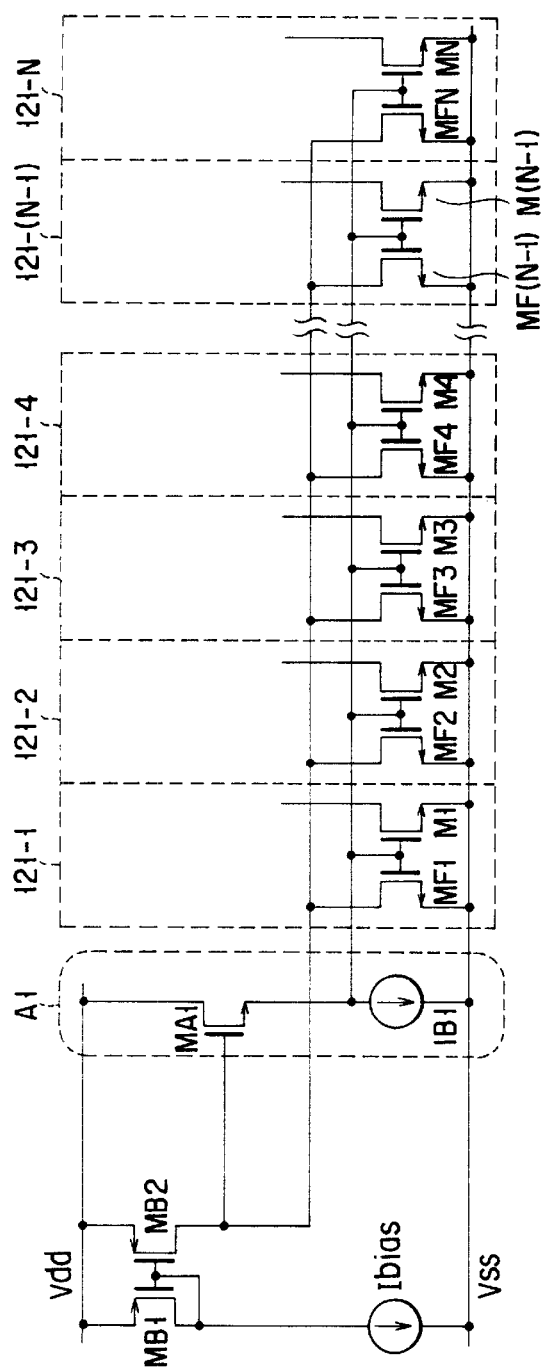
FIG. 15 is a circuit diagram showing the arrangement of an integrated circuit device according to the seventh embodiment of the present invention.

FIG. 15 shows the seventh embodiment in which the amplifier A1 of the integrated circuit device shown in FIG. 14 is realized by the source follower constituted by a transistor MA1 and current source IB1.

Figure 16:
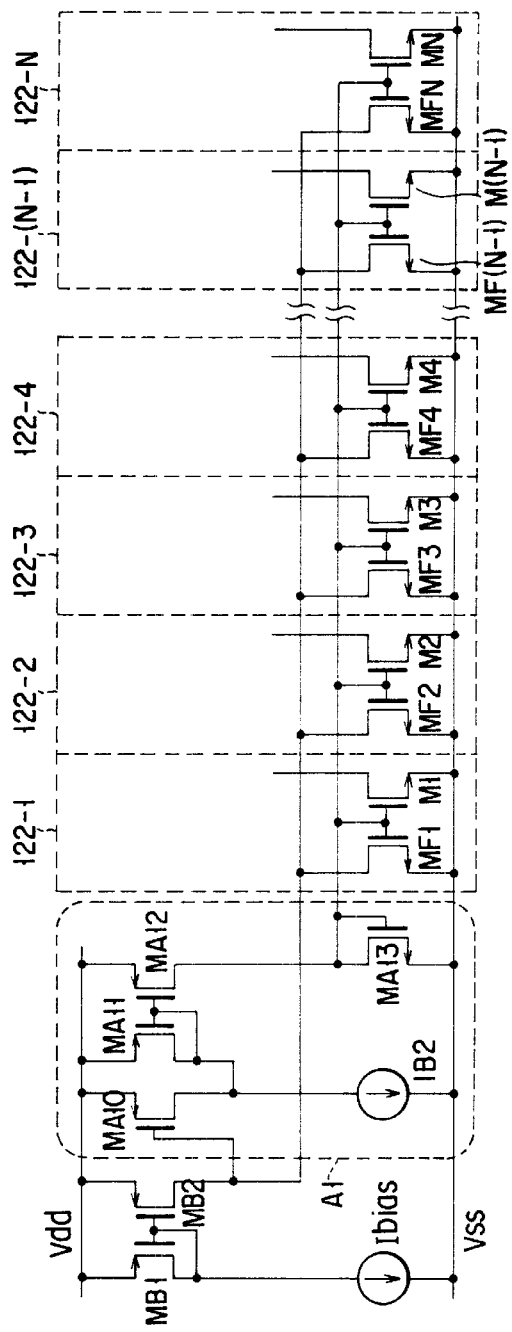
FIG. 16 is a circuit diagram showing the arrangement of an integrated circuit device according to the eighth embodiment of the present invention.

FIG. 16 shows an integrated circuit device according to the eighth embodiment. According to this embodiment, the amplifier A1 of the integrated circuit device shown in FIG. 14 comprises a transistor MA10 for generating a current corresponding to an input voltage to the amplifier A1, a diode-connected transistor MA11 for receiving the difference current between a current flowing in the transistor MA10 and a bias current IB2, a transistor MA12 that constitutes a current mirror circuit, together with the transistor MA11, and folds/outputs the difference current between the current flowing in the transistor MA10 and the bias current IB2, and a diode-connected transistor MA13 for receiving this current. This transistor MA13 constitutes current mirror circuits, together with output transistors M1 to MN and monitoring transistors MF1 to MFN.

For the sake of simplicity, assume that the transistors MA10 to MA12 have the same size, and the size of the transistor MA13 is equal to that of each of the transistors M1 to MN. Assume also that $IB2=2I_{bias}$.

The current generated by the transistor MA10 in accordance with an input voltage to the amplifier A1 is compared with the bias current IB2, and the difference current is folded by the current mirror circuit constituted by the transistors MA11 and MA12. If this difference current is larger than $I_{bias}$, the average of the currents flowing in the monitoring transistors MF1 to MFN is larger than $I_{bias}/N$, and hence the sum of the currents in the monitoring transistors MF1 to MFN becomes larger than $I_{bias}$. For this reason, the drain voltage of the transistor MB2 decreases. As a consequence, the gate-source voltage of the input transistor MA10 of the amplifier A1 increases, and the difference current between this current and the bias current IB2 becomes closer to $I_{bias}$.

If the difference current between the bias current IB2 and the current generated by the transistor MA10 in accordance with an input voltage to the amplifier A1 is smaller than $I_{bias}$, the average of the currents flowing in the monitoring transistors MF1 to MFN becomes smaller than $I_{bias}/N$. Since the sum of currents of the monitoring transistors MF1 to MFN is smaller than $I_{bias}$, the drain voltage of the transistor MB2 therefore increases. As a consequence, the gate-source voltage of the transistor MA10 of the amplifier A1 decreases, and the difference current between the bias current $I_{bias}$ and the current generated in accordance with the input voltage becomes closer to $I_{bias}$.

In general, if the monitoring transistors MF are divided by the number N of amplifier circuits integrated into one chip, since the number of amplifier circuit often becomes as large as 300, each monitoring transistor MFi (i=1 to N) becomes a very small transistor. In practice, therefore, such small transistors are difficult to form in some cases. In such a case, the division number is set to N/L (L is a positive integer), and the monitoring transistors MFi are arranged for every L amplifier circuits, thus obtaining the same effect as that described above.

Figure 17:
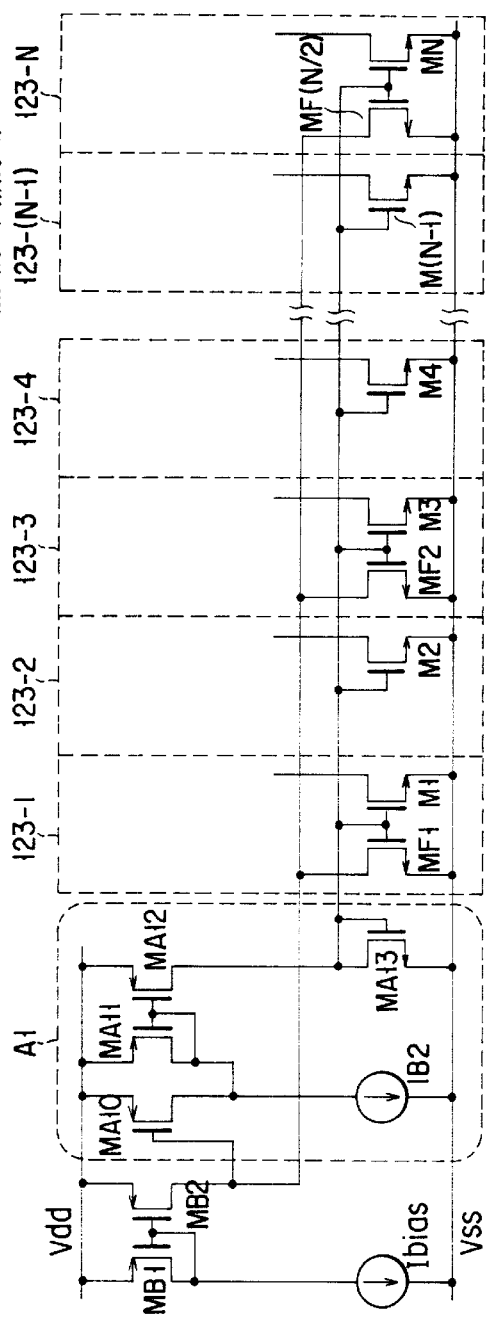
FIG. 17 is a circuit diagram showing the arrangement of an integrated circuit device according to the ninth embodiment of the present invention.

FIG. 17 shows an integrated circuit device according to the ninth embodiment with L=2.

Figure 18:
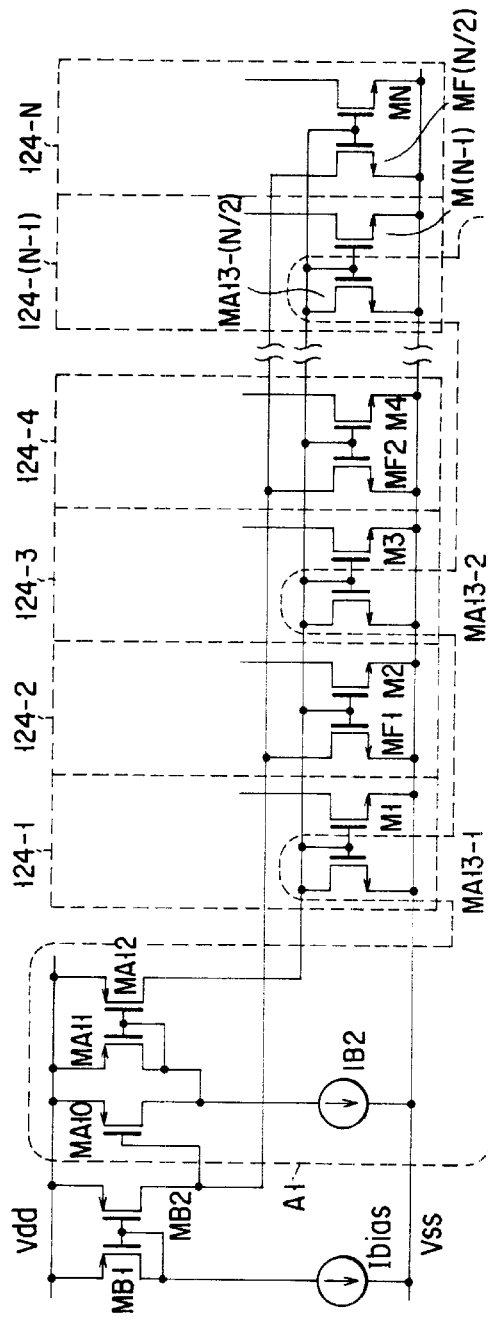
FIG. 18 is a circuit diagram showing the arrangement of an integrated circuit device according to the 10th embodiment of the present invention.

As in an integrated circuit device according to the 10th embodiment shown in FIG. 18, a plurality of diode-connected transistors MA13-1 to MA13-(N/2) of an amplifier A1, which constitute current mirror circuits together with output transistors Mi (i=1–N) and monitoring transistors MFi (i=1 to N), and the plurality of monitoring transistors MFi may be alternately arranged in amplifier circuits 124-1 to 124-N.

Figure 19:
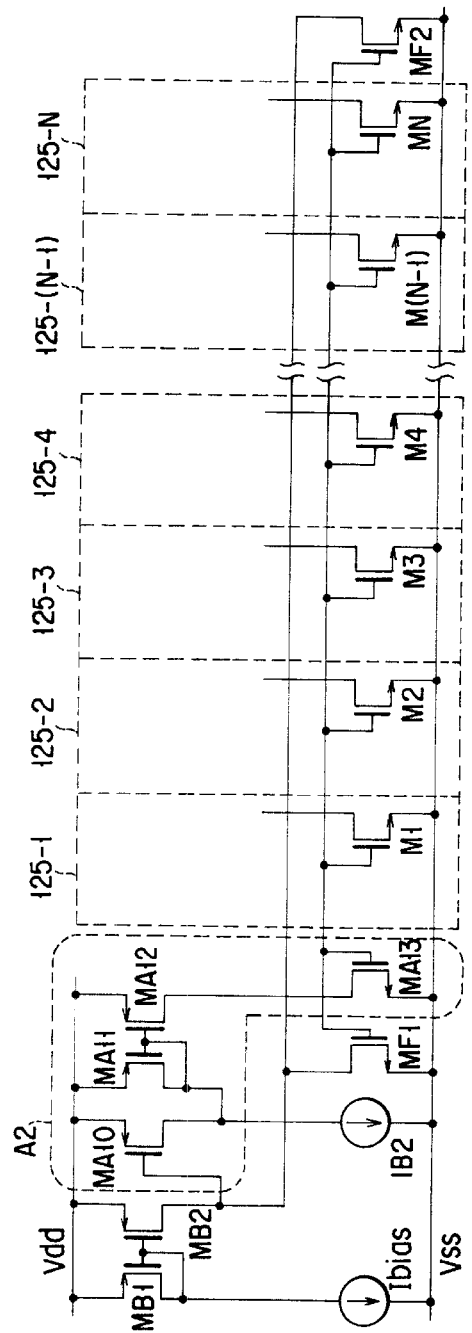
FIG. 19 is a circuit diagram showing the arrangement of an integrated circuit device according to the 11th embodiment of the present invention.
Figure 20:
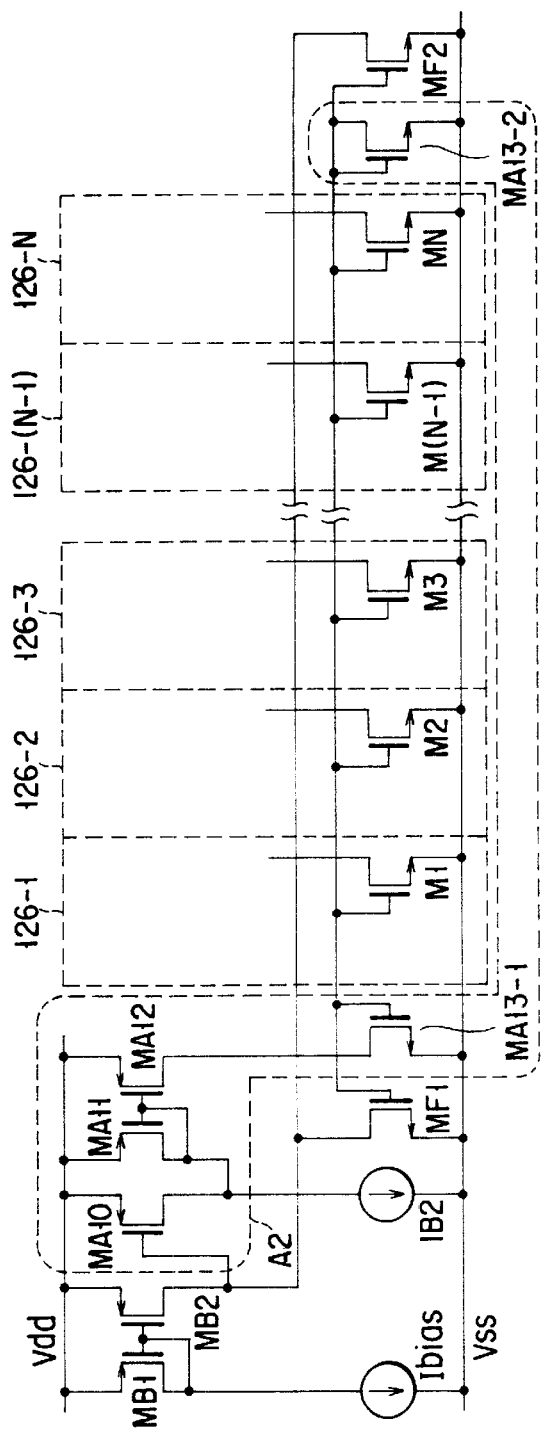
FIG. 20 is a circuit diagram showing the arrangement of an integrated circuit device according to the 12th embodiment of the present invention.

In addition, as in an integrated circuit device according to the 11th embodiment shown in FIG. 19, two monitoring transistors MF1 and MF2 may be arranged on the two ends of an array of a plurality of amplifier circuits to shorten the distances between the monitoring transistors MF1 and MF2 and transistors M1 to MN in the amplifier circuits, thereby realizing better matching and reducing deviations. In this case, as in the 12th embodiment shown in FIG. 20, diode-connected transistors MA12-1 to MA13-2 of an amplifier A1 may be arranged at the two ends of an array of a plurality of amplifier circuits 126-1 to 126N.

Figure 21:
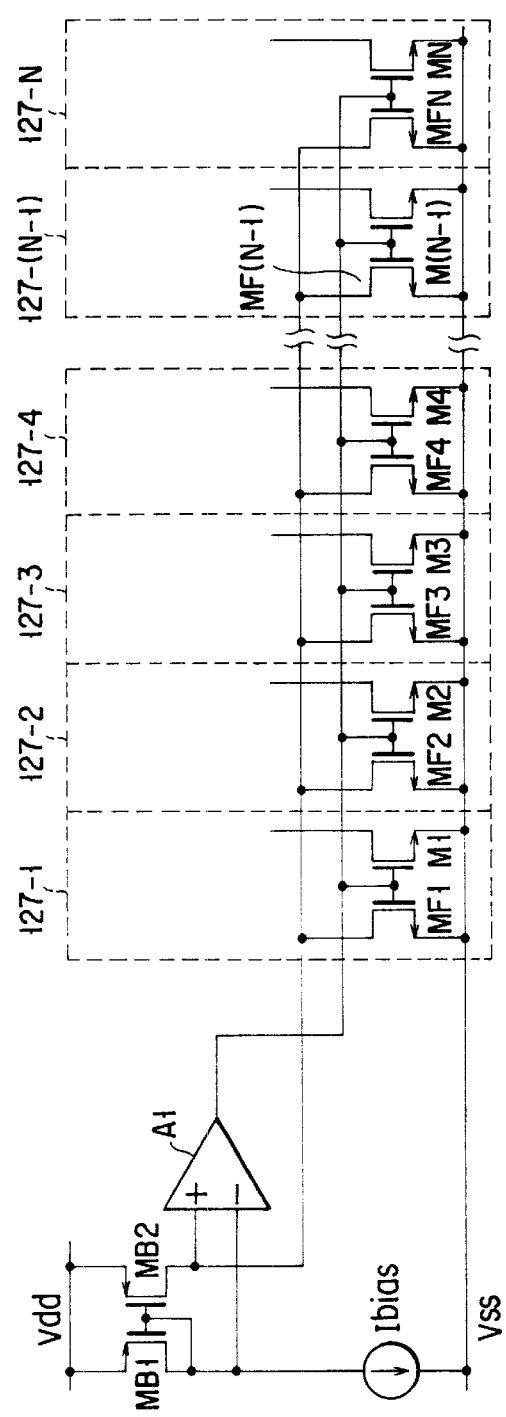
FIG. 21 is a circuit diagram showing the arrangement of an integrated circuit device according to the 13th embodiment of the present invention.

FIG. 21 shows an integrated circuit device according to the 13th embodiment in which a differential amplifier circuit is used as an amplifier A1. According to this embodiment, by connecting the negative input terminal of the differential amplifier circuit to the drain of a transistor MB1, control can be performed to make the drain voltage of the transistor MB1 become equal to that of a transistor MB2. This makes it possible to increase the precision of the current mirror constituted by the transistors MB1 and MB2.

Figure 22:
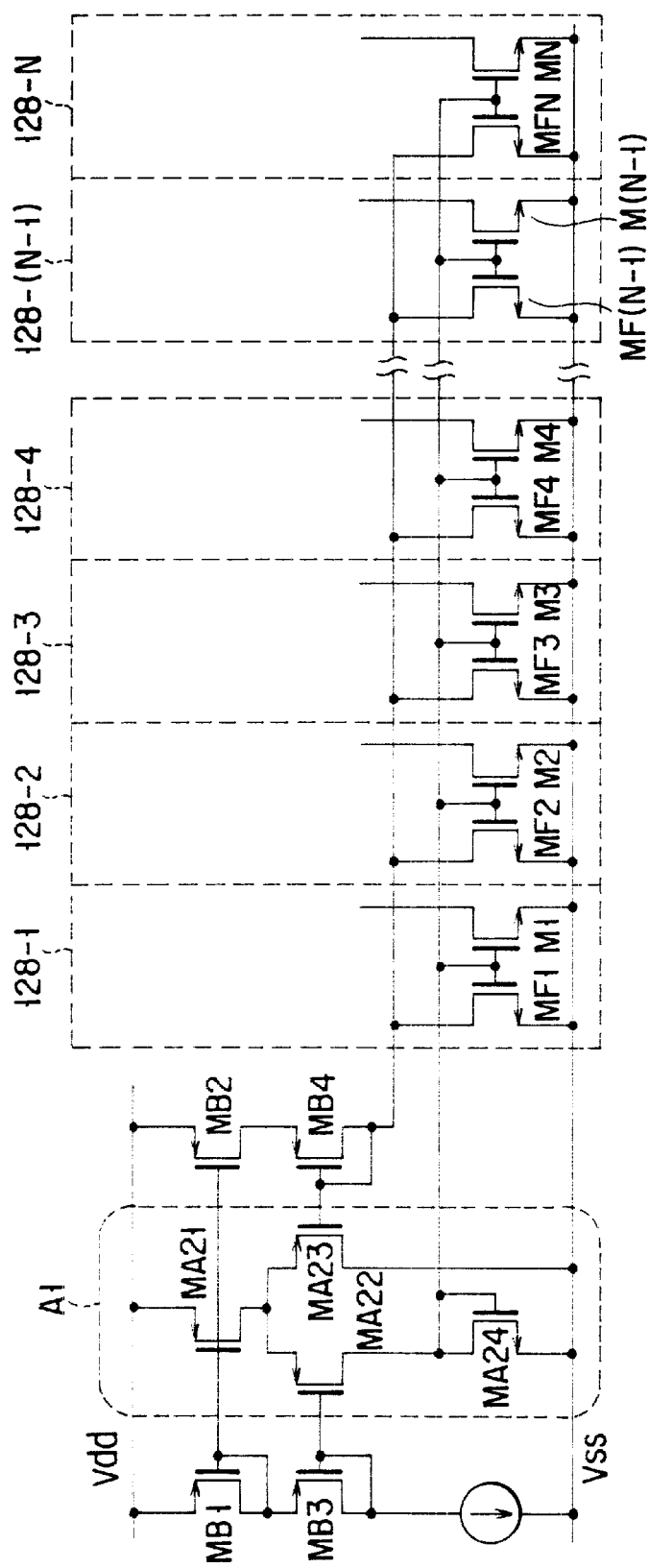
FIG. 22 is a circuit diagram showing the arrangement of an integrated circuit device according to the 14th embodiment of the present invention.

In an integrated circuit device according to the 14th embodiment shown in FIG. 22, a differential amplifier circuit is used as the amplifier A1 in FIG. 21. This differential amplifier circuit comprises transistors MA22 and MA23 constituting an input differential pair, a transistor MA21 for supplying a current to the input differential pair, and a diode-connected transistor MA24 which receives an output current from the transistor MA22 and constitutes a current mirror circuit, together with transistors M1 to MN of amplifier circuits 128-1 to 128-N and monitoring transistors MF1 to MFN. In this case, the drain voltage of a transistor MB1 is level-shifted by using a diode-connected transistor MB3 such that the input voltage of the differential amplifier circuit falls within the operation range of the differential amplifier circuit. A diode-connected transistor MB4 is a level-shifting transistor that is inserted to make the drain voltage of a transistor MB2 become equal to that of the transistor MB1.

For the sake of simplicity, assume that the W/L of the transistor MA21 is twice the W/L of the transistor MB1. A current twice $I_{bias}$ therefore flows in the transistor MA21. Assume also that the transistors MB3, MB4, MA22, and MA23 are equal in size. In addition, assume that the size of the transistor MA24 is equal to that of each of the transistors M1 to MN.

The positive input voltage of the amplifier A1 which is applied to the gate of the transistor MA23 is compared with the negative input voltage applied to the gate of the transistor MA22, i.e., the voltage obtained by the transistor MB3 level-shifting the drain voltage of the transistor MB1 by a gate/source voltage. If the sum of currents flowing in the monitoring transistors MF1 to MFN is larger than the current $I_{bias}$ folded by the current mirror constituted by the transistors MB1 and MB2, and the positive input voltage is lower than the negative input voltage, more than half of the current supplied from the transistor MA21 flows in the transistor MA23, and the current flowing in the transistor MA22 becomes smaller than $I_{bias}$. The current flowing in the transistor MA22 is input to the diode-connected transistor MA24, and the gate voltage of the transistor MA24 decreases. As a consequence, the sum of currents flowing in the monitoring transistors MF1 to MFN decreases to become closer to $I_{bias}$. If the sum of currents flowing in the monitoring transistors MF1 to MFN is smaller than the current $I_{bias}$ folded by the current mirror constituted by the transistors MB1 and MB2, and the positive input voltage is higher than the negative input voltage, more than half of the current supplied from the transistor MA21 flows in the transistor MA23. The current flowing in the transistor MA22 becomes larger than $I_{bias}$. The current flowing in the transistor MA22 is then input to the diode-connected transistor MA24, and the gate voltage of the transistor MA24 increases. As a consequence, the sum of currents flowing in the monitoring transistors MF1 to MFN becomes closer to $I_{bias}$.

As has been described above, according to the integrated circuit device of the present invention, in current mirror circuits as part of a bias circuit for electronic circuits such as a plurality of amplifier circuits, an output-side transistor is provided for each electronic circuit, and input-side transistors are distributed to and arranged in a plurality of electronic circuits, or arranged adjacent to the electronic circuits on the two sides. This arrangement makes it possible to reduce deviations in the threshold voltage of input-side transistors between chips and decrease the differences in the current consumption and characteristics between the chips.

According to the present invention, there is provided a liquid crystal display apparatus which allows easy design of a power supply, in particular, by using such an integrated circuit device for a driver circuit, and reduces a deterioration in image quality due to differences in characteristics between chips.

In addition, since a plurality of monitoring transistors are arranged near output transistors for generating bias currents in the respective circuits, matching between the monitoring transistors and the transistors for generating bias currents in the respective circuits can be improved, thereby reducing the differences in current consumption and characteristics between chips.

Furthermore, if a group of amplifier circuits in a driver circuit for a liquid crystal display apparatus is formed by using an integrated circuit device according to the present invention, since the differences in current consumption and characteristics between chips are small, a liquid crystal display apparatus with little deterioration in image quality due to deviations in characteristics can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An integrated circuit device comprising:
   a plurality of electronic circuits; and
   a plurality of current mirror circuits comprising a plurality of diode-connected input-side transistors which receive an input current for setting a bias current and are distributed to said plurality of electronic circuits, and a plurality of output-side transistors which respectively supply output currents corresponding to the input current, as bias currents, to said plurality of electronic circuits,
   wherein said plurality of electronic circuits and said current mirror circuit are integrated into one chip.

2. A device according to claim 1, wherein said plurality of electronic circuits are integrated in an array in the chip, and said input-side transistors are distributed to every L, where L is an integer not less than one, electronic circuits of said plurality of electronic circuits.

3. A device according to claim 1, wherein said plurality of electronic circuits are integrated in an array in the chip, and only P, where P is an integer satisfying $P \leq M$, transistors in every M diode-connected input-side transistors in said plurality of electronic circuits are connected to each other so as to comprise current mirror circuits.

4. A device according to claim 1, wherein said input-side transistors comprise two input-side transistors arranged on two ends of an array of said plurality of electronic circuits.

5. A liquid crystal display apparatus comprising:
a liquid crystal display including a plurality of pixels, signal lines for selectively supplying video signals to the respective pixels and scanning lines crossing the signal lines;
a driver circuit including a group of amplifier circuits configured to amplify video signals and supply the signals to the signal lines and drives the signal lines; and
wherein the group of amplifier circuits are integrated into a plurality of chips in units of a predetermined number of amplifier circuits, each of the chips including integrated current mirror circuits comprising a plurality of diode-connected input-side transistors which receive an input current for setting a bias current, and a plurality of output-side transistors configured to respectively supply output currents corresponding to the input current, as bias currents, to said amplifier circuits, and said plurality of input-side transistors are distributed to said plurality of amplifier circuits incorporated in each of the chips.

6. An apparatus according to claim 5, wherein said predetermined number of amplifier circuits are integrated in an array in a corresponding one of the chips, and said input-side transistors are distributed to every L, where L is an integer not less than one, amplifier circuits of said plurality of amplifier circuits.

7. An apparatus according to claim 5, wherein said predetermined number of amplifier circuits are integrated into an array in a corresponding one of the chips, and only P, where P is an integer satisfying $P \leq M$, transistors in every M diode-connected input-side transistors in said predetermined number of amplifier circuits are connected to each other so as to constitute current mirror circuits.

8. An apparatus according to claim 5, wherein said predetermined number of amplifier circuits are integrated in an array in a corresponding one of the chips, and said input-side transistors comprise two input-side transistors arranged on two ends of an array of said plurality of amplifier circuits.

9. An integrated circuit device comprising:
a plurality of electronic circuits;
a plurality of output transistors configured to receive a setting voltage for setting a bias current and supply output currents as bias currents to said electronic circuits;
a plurality of monitoring transistors distributed to said plurality of electronic circuits to output monitoring currents upon reception of the setting voltage; and
an amplifier configured to amplify a voltage corresponding to a difference between the monitoring current and a set input current and output the setting voltage.

10. A device according to claim 9, wherein said amplifier comprises one of a source follower and emitter follower.

11. A device according to claim 9, wherein said amplifier includes an output stage having at least one diode-connected transistor comprising current mirror circuits together with said plurality of output transistors.

12. A device according to claim 11, wherein said plurality of electronic circuits are integrated in an array in a chip, and said at least one diode-connected transistor includes a plurality of diode-connected transistors connected in parallel and distributed to every M, where M is an integer not less than one, electronic circuits of said plurality of electronic circuits.

13. A device according to claim 9, wherein said plurality of electronic circuits are integrated in an array in a chip, and said monitoring transistors are distributed to every L, where L is an integer not less than one, electronic circuits of said plurality of electronic circuits.

14. A device according to claim 9, wherein said plurality of electronic circuits are integrated in an array in a chip, and said monitoring transistors comprise at least two monitoring transistors which are arranged on two ends of an array of said plurality of electronic circuits and output monitoring currents upon reception of the setting voltage.

15. A device according to claim 9, wherein said plurality of electronic circuits are integrated in an array in a chip, and said diode-connected transistors comprise at least two parallel-connected transistors and are arranged on two ends of an array of said electronic circuits.

16. A liquid crystal display apparatus comprising:
a liquid crystal display including a plurality of pixels, signal lines for selectively supplying video signals to the pixels, and scanning lines crossing the signal lines;
a group of amplifier circuits configured to amplify video signals and supply the signals to the signal lines;
a driver circuit configured to drive the signal lines; and
a selector circuit configured to select the scanning lines, wherein said group of amplifier circuits are integrated into a plurality of chips in units of a predetermined number of amplifier circuits, and each of the chips comprises
a plurality of output transistors configured to receive a setting voltage for setting a bias current and supply output currents as bias currents to said amplifier circuits,
a plurality of monitoring transistors distributed to said plurality of amplifier circuits to output monitoring currents upon reception of the setting voltage; and
an amplifier configured to amplify a voltage corresponding to a difference between the monitoring current and a set input current and output the setting voltage.

17. An apparatus according to claim 16, wherein said amplifier comprises one of a source follower and emitter follower.

18. An apparatus according to claim 16, wherein said amplifier includes an output stage having a diode-connected transistor comprising current mirror circuits, together with said plurality of output transistors.

19. An apparatus according to claim 18, wherein said plurality of electronic circuits are integrated in an array in a chip, and said diode-connected transistors comprise a plurality of parallel-connected transistors and are distributed to every M, where M is an integer not less than one, electronic circuits of said plurality of electronic circuits.

20. An apparatus according to claim 16, wherein said plurality of electronic circuits are integrated in an array in a chip, and said monitoring transistors are distributed to every L, where L is an integer not less than one, electronic circuits of said plurality of electronic circuits.

21. An apparatus according to claim 16, wherein said plurality of electronic circuits are integrated in an array in a chip, and said monitoring transistors comprise at least two monitoring transistors which are arranged on two ends of an array of said plurality of electronic circuits and output monitoring currents upon reception of the setting voltage.

22. An apparatus according to claim 16, wherein said plurality of electronic circuits are integrated in an array in a chip, and said diode-connected transistors comprise at least two parallel-connected transistors and are arranged on two ends of an array of said electronic circuits.

* * * * *